United States Patent
Harada

(10) Patent No.: US 6,743,718 B1
(45) Date of Patent: Jun. 1, 2004

(54) PROCESS FOR PRODUCING BARRIER FILM AND BARRIER FILM THUS PRODUCED

(75) Inventor: Masamichi Harada, Chigasaki (JP)

(73) Assignee: Nihon Shinku Gijutsu Kabushiki Kaisha, Chigasaki (JP)

( * ) Notice: Subject to any disclaimer, the term of this patent is extended or adjusted under 35 U.S.C. 154(b) by 0 days.

(21) Appl. No.: 09/504,923

(22) Filed: Feb. 16, 2000

(30) Foreign Application Priority Data

Feb. 17, 1999 (JP) .............................. 11-38041
Jul. 6, 1999 (JP) ............................ 11-192026

(51) Int. Cl.[7] ...................... H01L 21/44; H01L 21/4763
(52) U.S. Cl. ...................... 438/656; 438/627; 438/648; 438/681; 438/685
(58) Field of Search ................. 438/653, 627, 438/643, 648, 656, 683, 685, 680, 681

(56) References Cited

U.S. PATENT DOCUMENTS 6,500,742 B1 * 12/2002 Chern et al. ................ 438/582

FOREIGN PATENT DOCUMENTS

| EP | 0 536 664 | 4/1993 |
| EP | 0 840 363 | 5/1998 |
| JP | 6-283532 | 7/1994 |
| WO | WO 96/17104 | 6/1996 |
| WO | WO 98/33950 | 8/1998 |

OTHER PUBLICATIONS

"MOCVD of TiN and /or Ti from New Precursors," Jaegab Lee et al. *Thin Solid Fioms* SH, Elsevier–Sequoia S.A. Lausanne. vol. 320, No. 1, May 4, 1998, pp. 15–19, XP000668459 ISSN: 0040–6090.

* cited by examiner

Primary Examiner—W. David Coleman
Assistant Examiner—Neal Berezny
(74) Attorney, Agent, or Firm—Armstrong, Kratz, Quintos, Hanson & Brooks, LLP.

(57) ABSTRACT

A thin nitrode film having a low resistance is formed at a low film-forming temperature. In the step of forming a thin nitride film of a high temperature-melting point metal by introducing a feedstock gas having the high temperature-melting point metal and a reductive nitrogen-containing gas having a nitrogen atom into a vacuum atmosphere; an auxiliary reductive gas free from nitrogen is also introduced. The high temperature-melting point metal deposited due to the auxiliary reductive gas compensates for the deficiency of the high temperature-melting point metal of the deposited nitride; and thus enable the growth of the thin nitride film having a low resistance.

13 Claims, 8 Drawing Sheets

PROCESS FOR PRODUCING BARRIER FILM AND BARRIER FILM THUS PRODUCED

FIELD OF THE INVENTION

This invention generally relates to the technical field of metal interconnecting for semiconductor devices. More particularly, it relates to a process for producing a barrier film which is to be located between a copper interconnecting film and an insulation film, a barrier film which is to be located between a film containing Si, GaAs, etc. and a metal interconnecting for preventing silicidation, and a barrier film which is to be located between a highly dielectric film or a ferroelectric film and an electrode.

BACKGROUND OF THE INVENTION

In recent years, it has been required to more and more speed up the operations of semiconductor devices. To satisfy this requirement, studies have been undertaken on low-resistant copper interconnectings as a substitute for aluminum interconnections.

However, copper occurs as an impurity in semiconductor crystals. In addition, it suffers from a problem of having a large diffusion coefficient in silicon crystals or silicon oxide. Therefore, it has been a practice that a thin film comprising the nitride of a high temperature-melting point metal (a thin tungsten nitride film, etc.) is formed as a barrier film on the surface of a silicon substrate or a thin silicon oxide film and then a copper interconnecting film is formed on the surface of the barrier film.

In order to form such a barrier film, the sputtering method, the heat CVD method or the PE-CVD method is used. In the sputtering method, a high temperature-melting point metal is employed as a target. In the heat CVD method, a thin nitride film is formed by the following reduction reactions. Formula (1) shows a case wherein tungsten is used, while formula (2) shows another case wherein titanium is used.

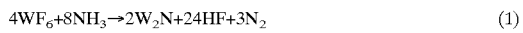

$$4WF_6 + 8NH_3 \rightarrow 2W_2N + 24HF + 3N_2 \quad (1)$$

$$TiCl_4 + NH_3 \rightarrow TiN + 2HCl + 1/2H_2 \quad (2)$$

In case of forming a semiconductor device with multi-layered interconnecting, it is needed to laminate copper interconnections while inserting interlayer insulation films between them. In a semiconductor device to be operated at high speed, the resistance of the copper interconnections as well as the capacity of the interlayer insulation films and the resistance of the barrier films and should be lowered so as to minimize signal transfer delay. More specifically, a barrier film should have a resistance as low as 200 to 300 $\mu\Omega$cm.

Although a thin nitride film having a low resistance can be formed by the sputtering method, only poor step coverage can be achieved thereby. Thus, no uniform barrier film can be formed in a viahole with a high aspect ratio by this method.

In the heat CVD method, on the other hand, a uniform barrier thin film can be formed in a viahole. However, the upper limit of the film-forming temperature in the heat CVD method resides in 400 to 500° C., since the dielectric constants of interlayer insulation films with low dielectric constants would be increased when exposed to a high temperature exceeding 500° C. At such a low film-forming temperature, the resistivity of, for example, a thin tungsten nitride film attains several thousand $\mu\Omega$cm, which makes it impossible to give barrier films with low resistance.

With respect to the CVD methods, barrier films with low resistance can be formed at a low temperature by the MOCVD method with the use of organometallic compounds or the plasma CVD method. However, the organometallic compounds are expensive, while the plasma CVD method has a problem of achieving only poor step coverage. Thus, these methods are not usable in practice.

SUMMARY OF THE INVENTION

The present invention, which has been made to overcome the above-described problems encountered in the conventional art, aims at providing a barrier film having a value of low resistivity and good step coverage.

The present inventors analyzed thin films of high temperature-melting point metal nitrides formed by the conventional heat CVD method and, as a result, found that the high temperature-melting point metal atoms were provided only in an insufficient amount. In the case of tungsten, for example, a tungsten nitride in the conventional art fails to establish the stoichiometric composition ($W_2N$), but shows a composition $W_xN$ wherein x ranges from about 1.5 to 1.6. It is assumed that such insufficient supply of metal atoms in a nitride might worsen the crystallinity of the thin nitride film, thereby elevating the value of the resistance.

In the present invention which has been completed based on the above-described finding, attempts are made to approximate the composition of the nitride of a high temperature-melting point metal closely to the stoichiometric level. In order to achieve this object, the present invention relates to a process for producing a barrier film which comprises the steps of providing a substrate in a vacuum atmosphere, introducing a feedstock gas having a high temperature-melting point metal in its structure and a reductive nitrogen-containing gas having a nitrogen atom into said vacuum atmosphere, and forming a thin film of the nitride of said high temperature-melting point metal on said substrate, wherein a nitrogen-free auxiliary reductive gas is introduced into said vacuum atmosphere.

The present invention relates to the process for producing a barrier film, which involves the step of introducing said auxiliary reductive gas together with said feedstock gas and said nitrogen-containing gas into said vacuum atmosphere.

The present invention relates to the process for producing a barrier film, which involves the step of introducing said feedstock gas and said nitrogen-containing gas into said vacuum atmosphere without introducing said auxiliary reductive gas.

The present invention relates to the process for producing a barrier film, wherein, in the step of introducing said auxiliary reductive gas together with said reductive nitrogen-containing gas and said feedstock gas, said reductive nitrogen-containing gas is introduced at a flow rate once or higher than the flow rate of said feedstock gas, and said auxiliary reductive gas is introduced at a flow rate once or more, but not more than 10 times higher than the flow rate of said reductive nitrogen-containing gas.

The present invention relates to the process for producing a barrier film, wherein, in the step of introducing said auxiliary reductive gas together with said reductive nitrogen-containing gas and said feedstock gas, said reductive nitrogen-containing gas is introduced at a flow rate once or more, but not more than 5 times higher than the flow rate of said feedstock gas, and said auxiliary reductive gas is introduced at a flow rate 2 times or more, but not more than 10 times higher than the flow rate of said reductive nitrogen-containing gas.

The present invention relates to the process for producing a barrier film, wherein, in the step of introducing said auxiliary reductive gas together with said reductive nitrogen-containing gas and said feedstock gas, said auxiliary reductive gas is introduced at a flow rate once or more, but not more than 15 times higher than the flow rate of the feedstock gas having said high temperature-melting point metal.

The present invention relates to the process for producing a barrier film, wherein, in the step of growing the thin film of the nitride of said high temperature-melting point metal, a diluent gas not reacting with said high temperature-melting point metal and a gas having an oxygen atom in its chemical structure are introduced so that the pressure of said vacuum atmosphere is regulated to 1 Pa or more, but not more than 100 Pa.

The present invention relates to a process for producing a barrier film which comprises the steps of forming a barrier film made of a thin nitride film of a high temperature-melting point metal on a substrate, wherein the surface of said substrate is exposed to a plasma of hydrogen and a plasma of at least one gas selected from among argon, nitrogen and helium gases, and then the thin film of the nitride of said high temperature-melting point metal is formed on the surface of the substrate.

The invention relates to a barrier film having a thin film of the nitride of a high temperature-melting point metal, wherein said thin nitride film has a content of said high temperature-melting point metal exceeding the stoichiometric composition ratio thereof.

The invention relates to a barrier film having a thin nitride film a high temperature-melting point metal formed on a substrate and aiming at preventing the diffusion of metals in a thin interconnecting film formed on said thin nitride film, wherein said thin nitride film is free from silicon.

These and other features of the invention will be understood upon reading of the following description along with the drawings.

In these drawings, each numerical symbol has the following meaning:

| | |
|---|---|
| 20 | substrate |
| 24, 33 | thin nitride films (barrier films) |
| 25 | thin metal film |
| 27, 35 | interconnecting films. |

DETAILED DESCRIPTION OF THE INVENTION

In the present invention which has the above-described constitution, a feedstock gas having a high temperature-melting point metal atom and a reductive nitrogen-containing gas are introduced into a vacuum atmosphere and the feedstock gas is thus reduced by the reductive nitrogen-containing gas to deposit the nitride of the high temperature-melting point metal, wherein a nitrogen-free auxiliary reductive gas is also introduced into the vacuum atmosphere so as to also allow the deposition of the high temperature-melting point metal.

Further, a diluent gas and a gas having an oxygen atom in its structure (oxygen gas, etc.) are simultaneously introduced. As a result, it becomes possible to form a nitride film having improved barrier performance and further lowered resistivity, compared with a case where no oxygen atom-containing gas is introduced.

When the nitride of the high temperature-melting plaint metal is deposited at a low temperature, the high temperature-melting point metal in the thin nitride film becomes deficient. However, the high temperature-melting point metal atoms deposited by the auxiliary reductive gas compensate for the deficiency. Thus, the obtained thin nitride film has a composition wherein the content of the high temperature-melting point metal exceeds the stoichiometric level thereof.

The amount of the deposited metal may be smaller than the amount of the deposited nitride. However, the auxiliary reductive gas should be introduced in a somewhat larger amount than the deposition level, since the auxiliary reductive gas is inferior in reactivity to the reductive nitrogen-containing gas.

When the auxiliary reductive gas is introduced at an excessively high rate, on the other hand, the content of the high temperature-melting point metal becomes unnecessarily large; and, as a result, the thin film exhibits properties close to the properties of the high temperature-melting point metal rather than those of the nitride. When an auxiliary reductive gas containing Si is employed, there arises a problem that the content of Si in the thin nitride film is increased. Therefore, the reductive nitrogen-containing gas, the auxiliary reductive gas, the diluent gas and the gas having an oxygen atom in its structure should each be introduced at an adequate rate.

For example, ammonia gas (i.e., the reductive nitrogen-containing gas) is introduced at rates 1.0, 2.6 and 5.0 times higher than that of tungsten hexafluoride (i.e., the feedstock gas) and the ratio of silane gas (i.e., the auxiliary reductive gas) to the ammonia gas is varied.

Figure 5:
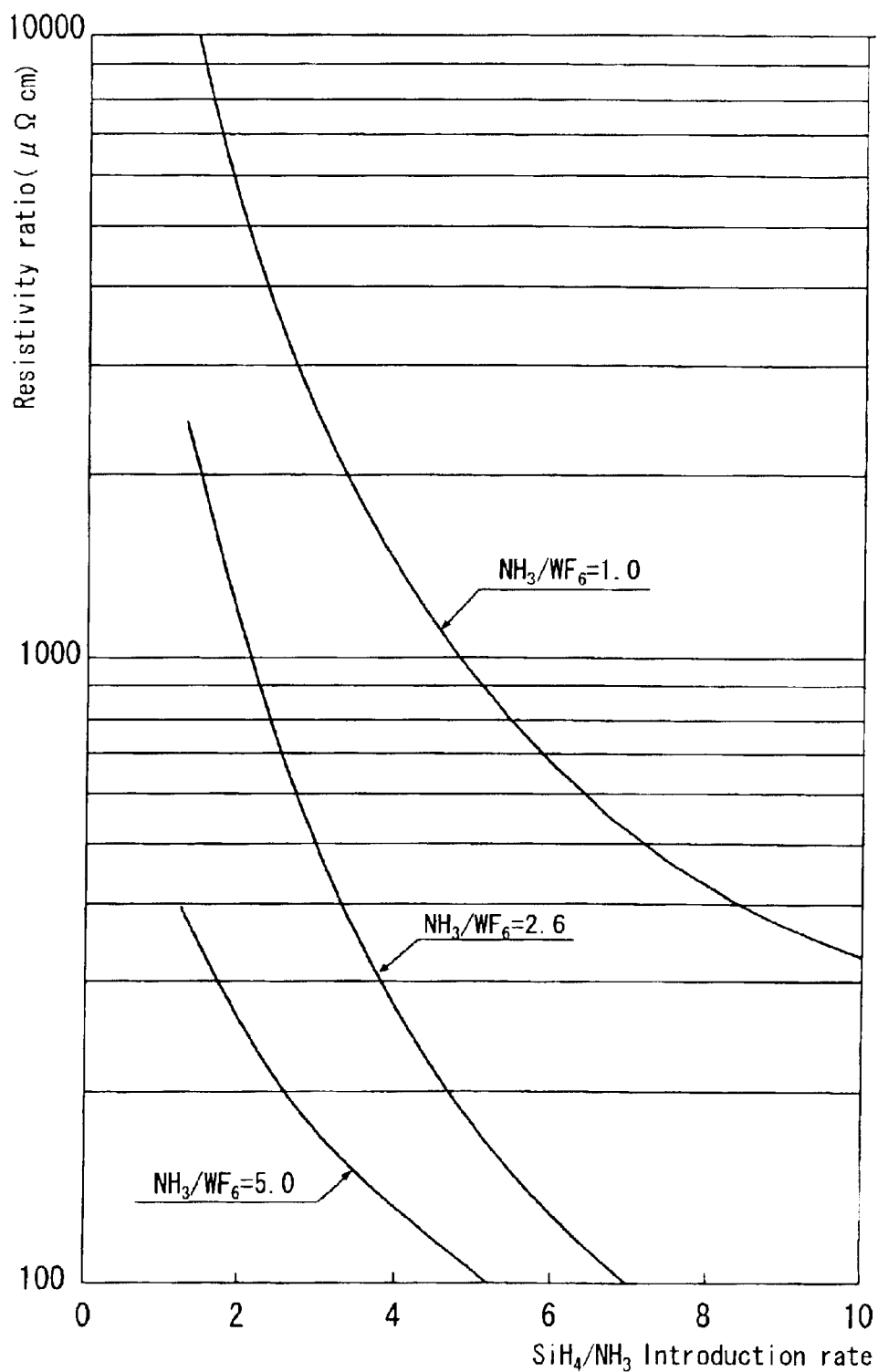
FIG. 5 is a graph which shows relationships between the resistivity of a thin tungsten nitride film formed by the process of the present invention and the flow rates of the feedstock gas, the reductive nitrogen-containing gas and the auxiliary reductive gas.

FIG. 5 shows the results wherein the abscissa indicates the introduction rate of the silane gas expressed by referring the introduction rate of the ammonia gas as to 1, while the ordinate indicates the resistivity of the thin tungsten nitride film thus formed.

As this graph shows, it is preferable that the reductive nitrogen-containing gas is introduced at a rate amount once or more larger than the introduction rate of the feedstock gas, while the auxiliary reductive gas is introduced at a rate 2 times or more, but not more than 10 times larger than the introduction rate of the reductive nitrogen-containing gas.

The practically available resistivity of a barrier film ranges from about 200 to 300 $\mu\Omega$.cm. Thus, it can be understood from this graph that the reductive nitrogen-containing gas is introduced preferably at a flow rate 1 time or more, but not more than 5 times higher than the flow rate of the feedstock gas; and the auxiliary reductive gas is introduced preferably at a flow rate 2 times or more, but not more than 5 times higher than the flow rate of the reductive nitrogen-containing gas.

Figure 6:
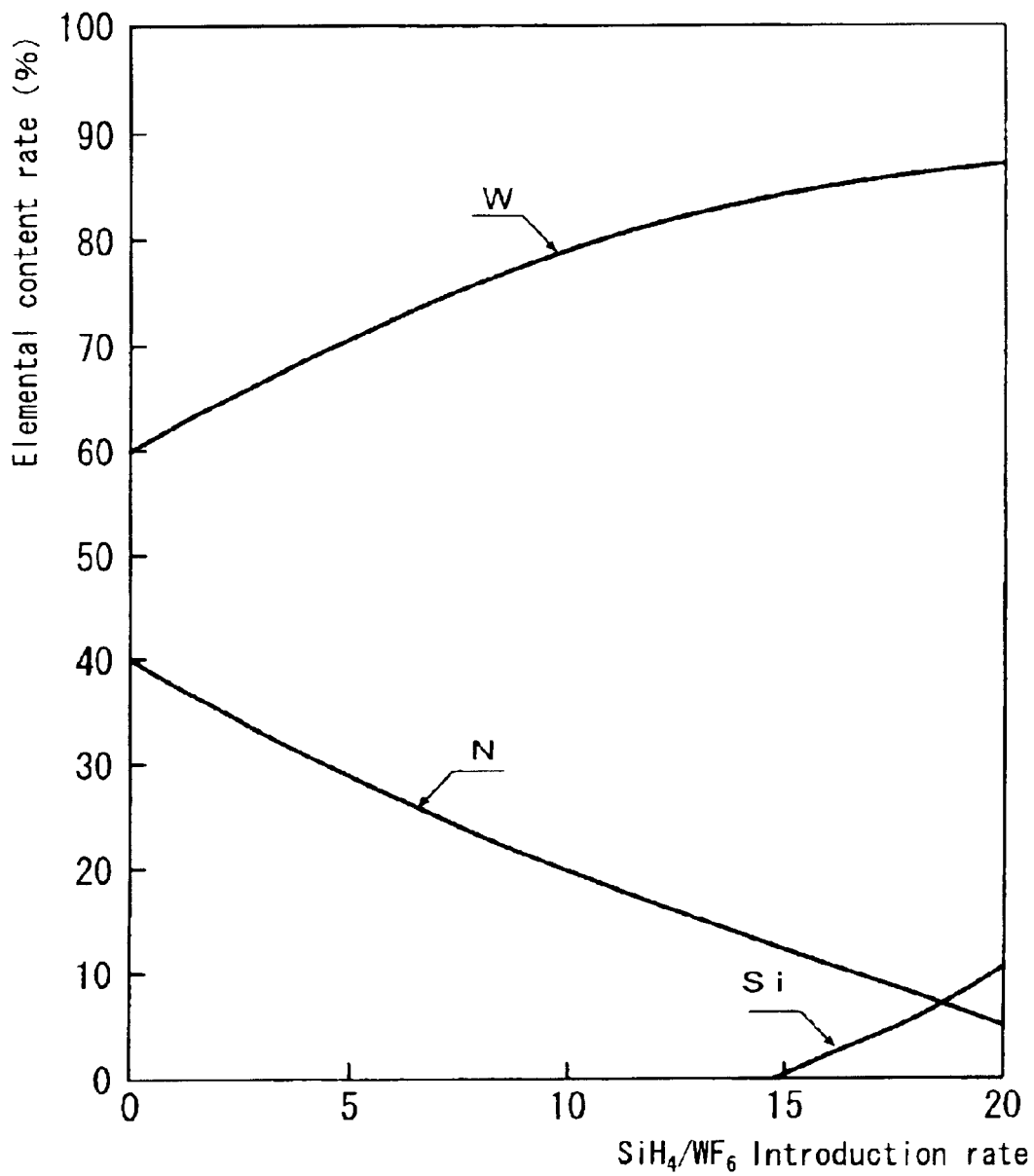
FIG. 6 is a graph which shows a change in the elemental content of a thin tungsten nitride film formed by the process of the present invention depending on the $SiH_4/WF_6$ flow rate.

FIG. 6 shows the elemental content of each high temperature-melting point metal nitride at various ratios of the flow rate of the feedstock gas to the flow rate of the auxiliary reductive gas in the step of forming high temperature-melting point metal nitrides. In this case, $WF_6$ is used as the feedstock gas and $SiH_4$ is used as the auxiliary reductive gas. Oxygen gas is introduced at 1.5 sccm.

As this graph shows, the high temperature-melting point metal nitride (WN in this case) contains Si when the ratio $SiH_4/WF_6$ attains 15 or more. This graph also shows that $W_xN$ thin films are formed within the scope of the ratio $SiH_4/WF_6$ of 1 to 15 time.

Figure 7:
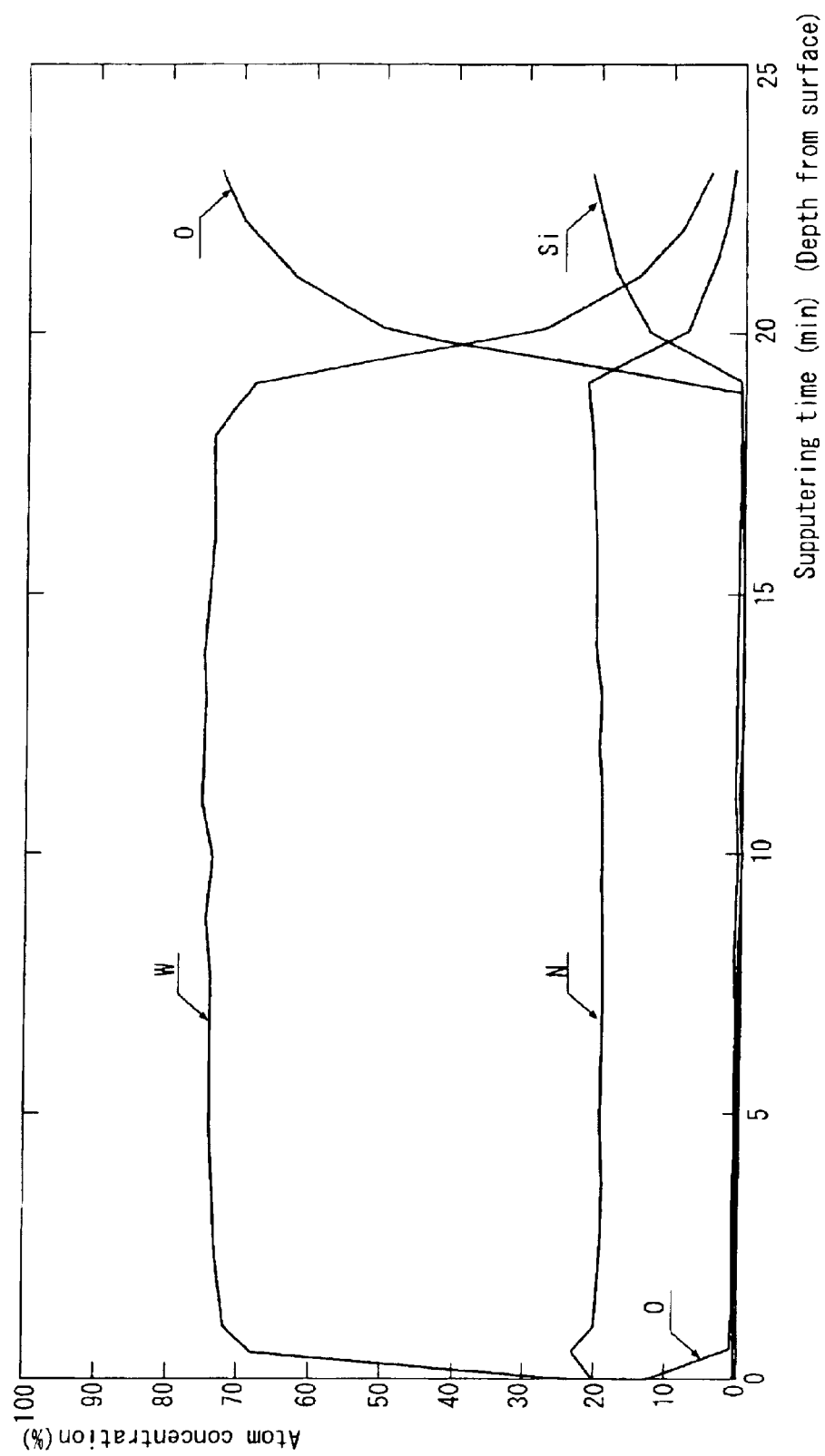
FIG. 7 is a graph which shows the composition of tungsten nitride formed by the process of the present invention in the depth direction.

FIG. 7 shows the results of Auger spectrochemical analysis of a thin tungsten nitride film formed at a film forming temperature of 400° C. wherein the sputtering time given in the abscissa indicates the depth from the surface. As this graph shows, much tungsten is contained therein (about 4.0 tungsten atoms per nitrogen atom), thereby indicating the effect of the introduction of the auxiliary reductive gas.

Since the barrier film is oxidized when it is taken out into the atmosphere, oxygen is observed on the film surface. Although silicon is seemingly contained in the film, the content thereof is less than the detection limit, i.e., a measurement error.

Thus, the resistivity can be lowered by using the high temperature-melting point metal in the thin nitride film at a level exceeding the stoichiometric composition ratio thereof while sustaining the barrier performance.

In the CMP process, a thin nitride film should be adhered closely to the surface of a substrate. When the surface of the substrate is cleaned with a plasma of at least one gas selected from among argon, nitrogen and helium gases, the plasma and the plasma of hydrogen gas, and a plasma of mixed nitrogen, the thin nitride film formed on this surface would not peel off even under a load of 1 kg/cm$^2$, thereby achieving an adhesiveness usable in the CMP process.

When the thin nitride film contains silicon, the silicon reacts with the high temperature-melting point metal (tungsten, etc.) at a high temperature to form a silicon compound, such as tungsten silicide, to thereby increase the resistivity. Since the thin nitride film of the present invention is free form silicon, no silicon compound is formed and thus the resistivity can be stabilized at a low level.

Figure 8:
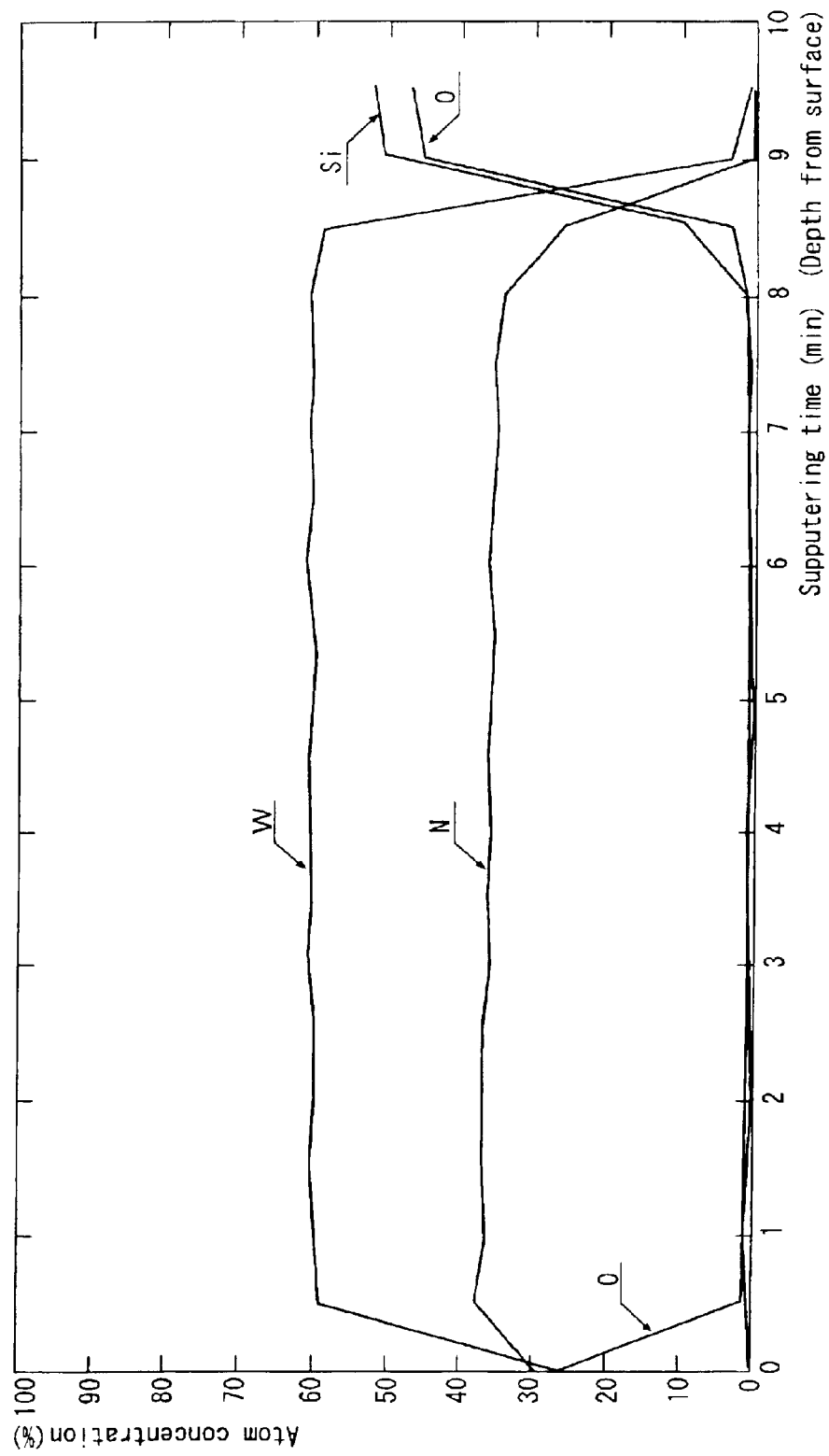
FIG. 8 is a graph which shows the composition of tungsten nitride of the conventional art in the depth direction.

For comparison, FIG. 8 shows the results of Auger spectrochemical analysis of a thin tungsten nitride film formed by the CVD method of the conventional art at a film forming temperature of 400° C. This thin film contains about 1.7 tungsten atoms per nitrogen atom, i.e., showing a smaller tungsten content. It also shows a high resistivity of 1000 $\mu\Omega$cm or more.

In the step of the formation of the thin nitride film of the high temperature-melting point metal, it is preferable to regulate the pressure to 1 Pa or more but not more than 10000 Pa; still preferably, 1 Pa or more, but not more than 100 Pa.

DESCRIPTION OF THE EMBODIMENTS OF THE INVENTION

Now, embodiments of the present invention will be described by reference to the attached drawings.

Figure 1:
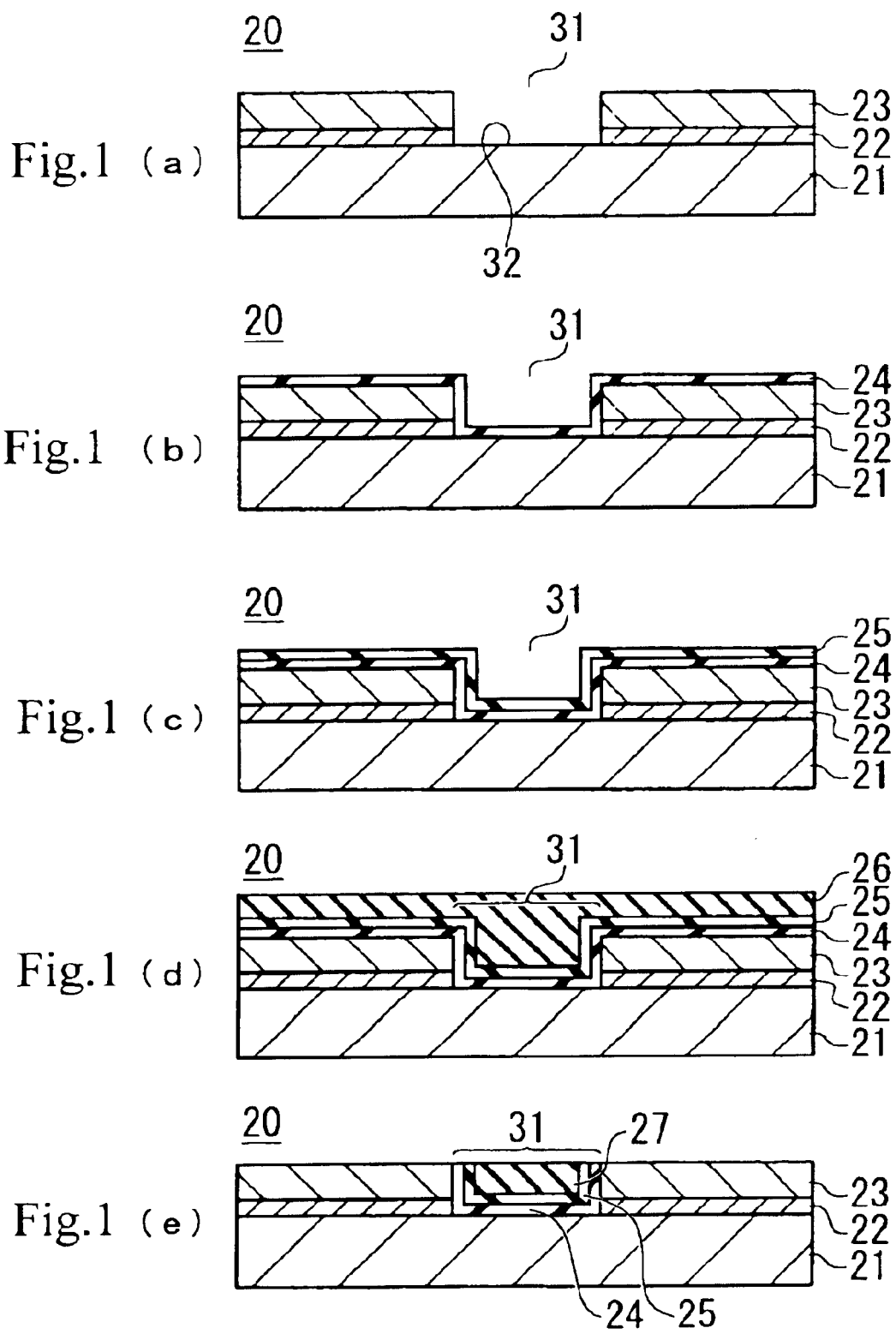
FIGS. 1(a) to (e) show the first half of a flow chart illustrating the process of the present invention.

FIGS. 1(a) to (d) show a flow chart, which shows an example of the embodiment of the present invention. In FIG. 1(a), the numerical symbol 20 shows a substrate to be treated. This substrate 20 has a semiconductor substrate 21 made of single silicon crystal on the surface of which a primary coat film 22 and an insulation film 23 made of silicon oxide are formed. The primary film 22 and the insulation film 23 are provided with a hole 31. The surface of semiconductor substrate 21 is exposed at a bottom 32 of the hole 31.

A barrier film is to be formed on the surface of this substrate 20.

Figure 4:
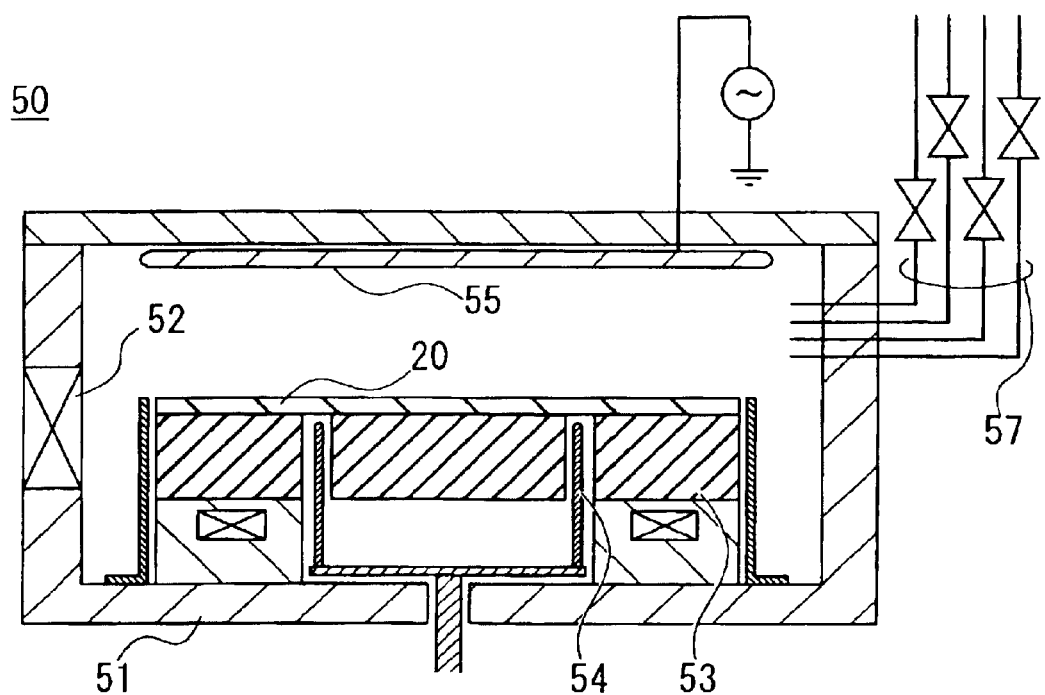
FIG. 4 shows an example of a CVD apparatus by which the process of the present invention can be embodied.

In FIG. 4, the numerical symbol 50 shows a CVD apparatus whereby the present invention can be embodied. This CVD apparatus 50 has a vacuum chamber 51 which is connected to a transport room (not shown). The vacuum chamber 51 is provided with a substrate holder 53 in the bottom side and an electrode 55 in the top side.

When a barrier film is to be formed on the substrate 20 by using this CVD apparatus 50, the substrate 20 is first brought All into the transport room; and the transport room and the vacuum chamber 51 are evacuated. Next, a gate valve 52 between the vacuum chamber 51 and the transport room is open; and then, the substrate 20 is brought into the CVD apparatus 50.

The substrate holder 53 is provided with a substrate elevator unit 54 with which the substrate brought into the vacuum chamber 51 is placed on the substrate holder 53. In FIG. 4, the substrate 20 is thus placed on the substrate holder 53.

Subsequently, the heater in the substrate holder 53 is switched on and thus the substrate 20 is heated to a temperature of not lower than 300° C., but not higher than 400° C.

The vacuum chamber 51 is provided with a gas inlet system 57 through which argon gas and ammonia gas are introduced into the vacuum chamber 51 each at a prescribed flow rate. By applying a high-frequency voltage between the substrate holder 53 and the electrode 55, ionized nitrogen and hydrogen are liberated from the ammonia gas. In this step, the ionized argon gas serving as a diluent gas is mixed with the ionized nitrogen and hydrogen to give a plasma.

The insulation film 23 on the surface of the substrate 20 is faced closely to the electrode 55. As the plasma is formed, the surface of the insulation film 23 and the surface of the semiconductor substrate 21 at the bottom of the hole 31 are exposed to the plasma and the organic deposits are decomposed (i.e., cleaning).

The cleaning is performed at an ammonia gas flow rate of 75 sccm, an argon gas flow rate of 240 sccm, under a pressure of 40 Pa and at a high-frequency electrical power of 100 W. After cleaning for about 50 seconds, the application of the high-frequency voltage is stopped to thereby extinguish the plasma. Although argon (Ar) gas is used in this case, it can be substituted by nitrogen ($N_2$) gas, helium (He) gas or a mixture thereof.

Next, the flow rates of the ammonia gas and the argon gas are changed and, at the same time, tungsten hexafluoride ($WF_6$) gas, silane gas and oxygen gas are introduced into the vacuum chamber 51 through the gas inlet system 57 together with the ammonia gas and the argon gas.

Since the ammonia gas is superior in the reactivity to the silane gas, the tungsten hexafluoride serves as the feedstock gas and the ammonia gas serves as the reductive nitrogen-containing gas. Thus, the reaction of reducing the feedstock gas proceeds. Since the ammonia gas contains nitrogen, tungsten nitride is deposited on the surface of the insulation film 23 and on the surface of the semiconductor substrate 21 in the hole 31 due to the reduction reaction represented by the above formula (1).

Although the silane gas introduced into the vacuum chamber 51 also has reductive properties, it is inferior in reactivity to the ammonia gas and, therefore, serves as the auxiliary reductive gas. Since the silane gas has no nitrogen atom, the feedstock gas is reduced thereby in accordance with the following formula (3); and thus, metal tungsten is deposited:

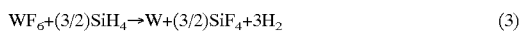

$$WF_6 + (3/2)SiH_4 \rightarrow W + (3/2)SiF_4 + 3H_2 \quad (3)$$

When metal tungsten is deposited, it is incorporated into the thin tungsten nitride film under growing. In other words, metal tungsten is supplied during the growth of the thin tungsten nitride film. When the thin tungsten nitride film grows at a low temperature, the deficiency of tungsten is thus compensated for and a barrier film (a thin tungsten nitride film) having a composition close to the stoichiometric composition or one having a high temperature-melting point metal content exceeding the stoichiometric level can be formed.

The thin tungsten nitride film may grow under, for example, the following conditions; substrate temperature: 380° C.; feedstock gas flow rate: 5 sccm; reductive nitrogen-containing gas flow rate: 13 sccm; auxiliary reductive gas flow rate: 39 sccm; argon gas flow rate: 240 sccm; oxygen gas introduction rate: 1.5 sccm; pressure: 40 Pa.

When the feedstock gas is subjected to the reduction reaction by the reductive nitrogen-containing gas and the auxiliary reductive gas for a prescribed period of time, a thin tungsten nitride film is formed on the surface of insulation film 23 and on the surface of the semiconductor substrate 21, as shown in FIG. 1(b) 24.

Next, the supply of the reductive nitrogen-containing gas is ceased and the flow rate of the auxiliary reductive gas is increased. Thus, the feedstock gas is reduced by the auxiliary reductive gas; and metal tungsten is deposited. In FIG. 1(c), the numerical symbol 25 shows a thin metal tungsten film growing on the surface of the thin nitride film 24.

The thin metal tungsten film may be formed under, for example, the following conditions; substrate temperature: 380° C.; feedstock gas flow rate: 20 sccm; auxiliary reductive gas flow rate: 5 sccm; diluent (argon) gas introduction rate: 240 sccm; pressure: 40 Pa.

Although the thin nitride film 24 has a favorable barrier performance against copper, it has a higher resistivity than that of the high temperature-melting point metal. On the other hand, the film of the high temperature-melting point metal (for example, thin metal tungsten film, etc.) has a poor barrier performance against copper, but has a much lower resistivity than that of the thin nitride film 24.

When a thin nitride film 24 is formed as a barrier film and a thin high temperature-melting point metal film is laminated thereon as in the above-described case, the resistivity can be lowered while sustaining the favorable barrier performance against copper.

On the contrary, a thin nitride film may be formed on a high temperature-melting point metal film or the thin nitride film may be formed as a single layer.

After allowing the thin tungsten film 25 to grow for 20 to 30 seconds under the above-described conditions, the substrate 20 is taken out from the CVD apparatus 50. Then, a thin copper film is grown on the surface of the thin high temperature-melting point metal film 25 by the metal plating method, the sputtering method, etc. In FIG. 1(d), the numerical symbol 26 shows this thin copper film 26.

After the formation of the thin copper film 26, the surface is abraded by the CMP method to thereby eliminate the thin copper film 26, the thin nitride film 24 and the thin metal film 25 on the insulation film 23. Thus, an interconnecting film 27 made of the thin copper film 26 is formed in the hole 31. The thin nitride film 24 is located between the interconnecting film 27 and the semiconductor substrate 21 and between the interconnecting film 27 and the insulation film 23 so as to prevent copper from diffusion.

Figure 2:
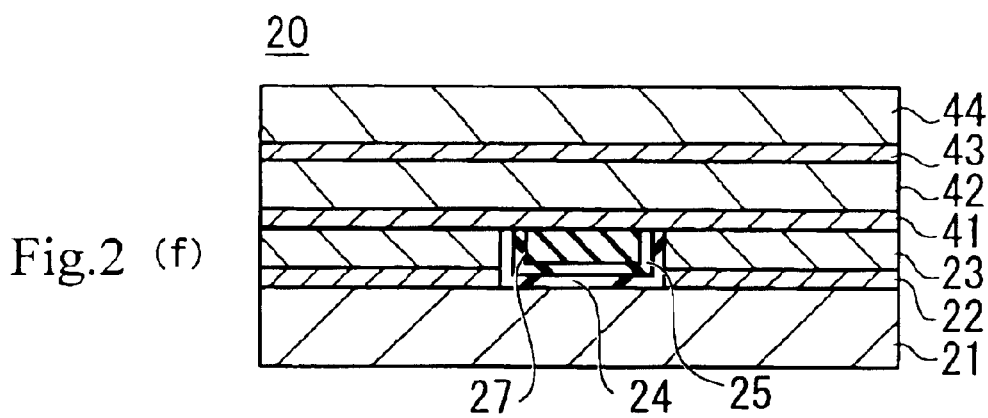
FIGS. 2(f) to (h) show the second half of a flow chart illustrating the process of the present invention.
Figure 2:
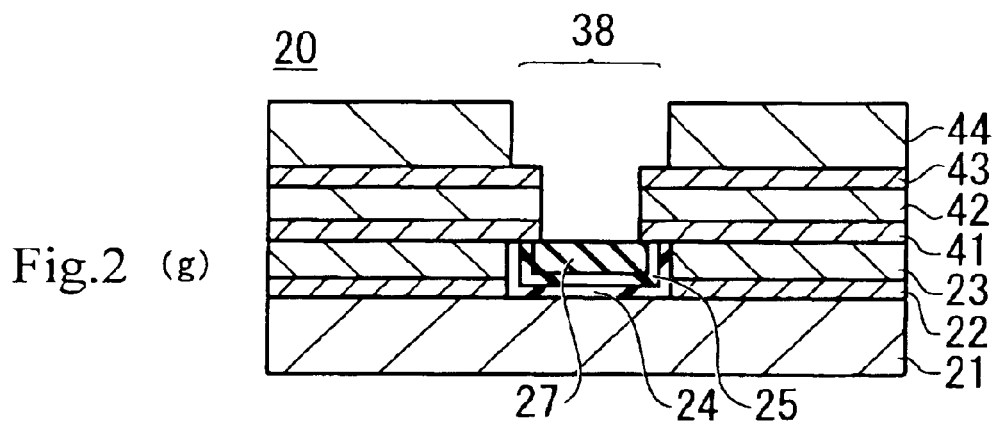
Figure 2:
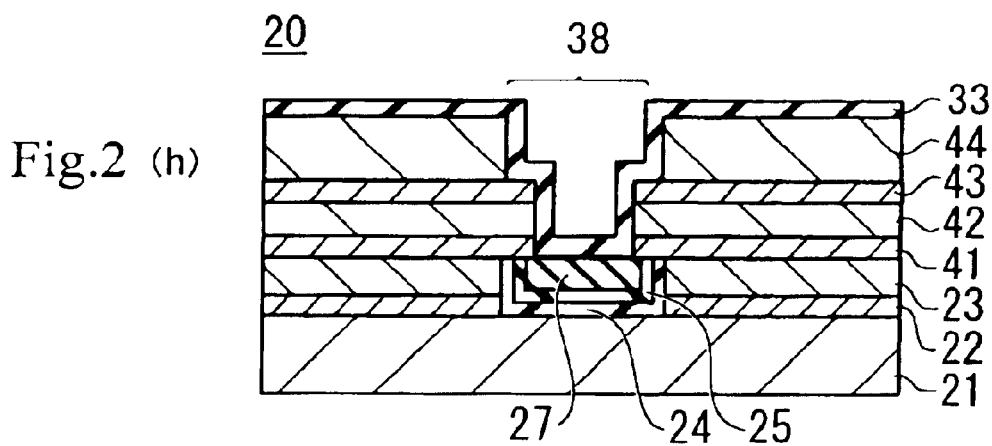

Next, primary films 41 and 43 and insulation films 42 and 44 are alternately laminated and the surface of the interconnecting film 27 is windowed to form a hole or a groove, as shown in FIG. 2(g). In FIG. 2(g), the numerical symbol 38 shows the groove or hole. The interconnecting film 27 is exposed on the bottom of this groove or hole 38.

Then, the substrate 20 is brought into the CVD apparatus 50 and a thin nitride film (a thin tungsten nitride film) is formed under the same conditions as in forming the thin nitride film shown in FIG. 1(b).

The numerical symbol 33 in FIG. 2(h) shows the thus formed thin nitride film which covers the inner face of the groove or hole 38 and the surface of the insulation film 44 and the surface of the interconnecting film 27.

Figure 3:
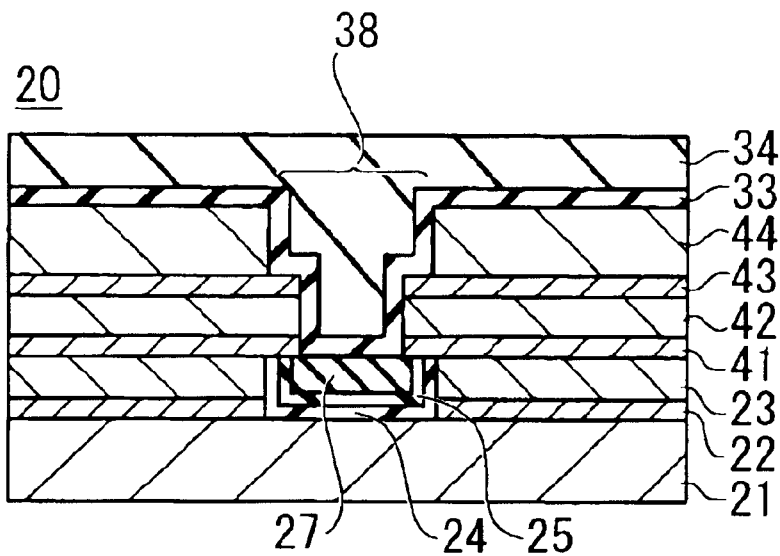
FIGS. 3(i) to (j) show the latter half of a flow chart illustrating the process of the present invention.
Figure 3:
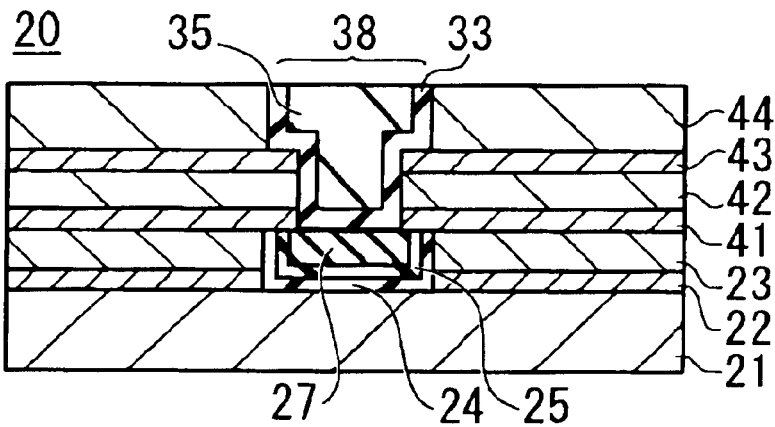

Subsequently, the thin copper film 34 is grown by the metal plating method or the sputtering method, as shown in FIG. 3(i). Thus, the groove or hole 38 is filled with the thin copper film 34.

Finally, the surface is abraded by the CMP method. Thus, an interconnecting film 35 is formed by the thin copper film 34 filled into the groove or hole 38, as shown in FIG. 3(j).

Since the barrier film 33 is located between the interconnecting film 35 and the insulation films 42 and 44, the diffusion of copper into the insulation films 42 and 44 can be prevented.

In the above-described case, a thin tungsten nitride film is formed by using tungsten as the high temperature-melting point metal, ammonia gas as the reductive nitrogen-containing gas and silane gas as the auxiliary reductive gas. Although tungsten hexafluoride is used as the feedstock gas in the above case, it is also possible to use $W(CO)_6$ gas therefor.

Moreover, the present invention involves within its scope cases where barrier films are produced by using high temperature-melting point metals other than tungsten and forming thin films of the nitrides thereof. When titanium (Ti) is used as the high temperature-melting point metal, titanium halide gases ($TiF_4$, $TiCl_4$, etc.) are usable as the feedstock gas. When tantalum (Ta) is used as the high temperature-melting point metal, tantalum halide gases ($TaCl_5$, etc.) are usable as the feedstock gas. It is also possible to use halides of Mo or Nb as the feedstock gas.

As the reductive nitrogen-containing gas containing a nitrogen atom, use can be made of $N_2H_4$ gas, $NF_3$ gas, $N_2O$ gas, etc. in addition to $NH_3$ gas.

As the nitrogen-free auxiliary reductive gas, use can be made of $H_2$ gas, $Si_2H_6$ gas, $PH_3$ gas, $B_2H_6$ gas etc. in addition to $SiH_4$ gas.

As the diluent gas, it is also possible to use argon gas, nitrogen gas, helium gas or a mixture of these gases.

The cleaning conditions as described above are given merely by way of example. Therefore, the cleaning may be performed under different conditions. For example, similar effects can be achieved by carrying out the cleaning for 60 seconds at an argon gas flow rate of 100 sccm, under a pressure of 1.0 Pa at a high-frequency electric power of 150 W.

After completing the cleaning under such conditions, additional cleaning may be performed by adding ammonia gas to the argon gas.

According to the present invention, a barrier film (a thin film of the nitride of a high temperature-melting point metal) having a low resistance can be formed by the CVD method at a temperature of 500° C. or lower, in particular, from 350 to 450° C. Therefore, interlayer insulation films are not damaged thereby.

Furthermore, the thin nitride film is formed by the heat CVD method, which makes it possible to achieve good step coverage.

What is claimed is:

1. A process for producing a barrier film of a tungsten nitride by a heat CVD method which comprises the steps of:
   providing a substrate on a substrate holder in a vacuum atmosphere within a CVD apparatus;
   heating said substrate;
   introducing a feedstock gas selected from tungsten hexafluoride gas and $W(CO)_6$ gas, a reductive nitrogen-containing gas selected from among $N_2H_4$ gas, $NF_3$ gas, $N_2O$ gas, and $NH_3$ gas, a nitrogen free auxiliary reductive gas selected from among $SiH_4$ gas, $H_2$ gas, $Si_2H_6$ gas, $PH_3$ gas, and $B_2H_6$ gas into said vacuum atmosphere so as to form a film of the tungsten nitride on said substrate;
   wherein $O_2$ gas is introduced into said vacuum atmosphere when forming the tungsten nitride film.

2. The process for producing a barrier film of a tungsten nitride by the heat CVD method according to claim 1, wherein said reductive nitrogen-containing gas is introduced at a flow rate once or more higher than the flow rate of said feedstock gas, and said nitrogen free auxiliary reductive gas is introduced at a flow rate once or more but not more than 10 times higher than the flow rate of said reductive nitrogen-containing gas.

3. The process for producing a barrier film of a tungsten nitride by the heat CVD method according to claim 1, wherein said reductive nitrogen-containing gas is introduced at a flow rate once or more but not more than 5 times higher than the flow rate of said feedstock gas, and said nitrogen free auxiliary reductive gas is introduced at a flow rate 2 times or more but not more than 10 times higher than the flow rate of said reductive nitrogen-containing gas.

4. The process for producing a barrier film of a tungsten nitride by the heat CVD method according to claim 1, wherein said nitrogen free auxiliary reductive gas is introduced at a flow rate once or more but not more than 15 times higher than the flow rate of the feedstock gas.

5. The process for producing a barrier film of a tungsten nitride by the heat CVP method according to claim 1, wherein the pressure of said vacuum atmosphere is regulated to 1 Pa or more but not more than 100 Pa when said tungsten nitride film is formed.

6. The process for producing a barrier film of a tungsten nitride by a heat CVD method according to claim 1, further comprising the steps of:
   forming a barrier film made of a film of the tungsten nitride on a substrate on a substrate holder in a vacuum atmosphere within a CVD apparatus;
   exposing the surface of said substrate to a plasma of hydrogen gas and a plasma containing at least one gas selected from among argon, nitrogen and helium gases;
   and then forming the film of the tungsten nitride on the surface of the substrate,
   wherein the step of forming the film includes the steps of heating the substrate.

7. A process for producing a barrier film of a tungsten nitride by the heat CVD method comprising the steps of:
   providing a substrate on a substrate holder in a vacuum atmosphere within a CVD apparatus;
   heating said substrate;
   introducing a feedstock gas selected from tungsten hexafluoride gas and $W(CO)_6$ gas, a reductive nitrogen-containing gas selected from among $N_2H_4$ gas, $NF_3$ gas, $N_2O$ gas, and $NH_3$ gas, a nitrogen free auxiliary reductive gas selected from among $SiH_4$ gas, $H_2$ gas, $Si_2H_6$ gas, $PH_3$ gas and $B_2H_6$ gas into said vacuum atmosphere so as to form a film of the tungsten nitride on said substrate, wherein said tungsten nitride film is formed by a plasma-free formation,
   wherein $O_2$ gas is introduced into said vacuum atmosphere when forming the tungsten nitride film.

8. The process for producing a barrier film of a tungsten nitride which comprises the steps of:
   providing a substrate on a substrate holder in a vacuum atmosphere within a CVD apparatus;
   heating said substrate;
   introducing a feedstock gas selected from tungsten hexafluoride gas and $W(CO)_6$ gas, and a $NH_3$ gas, and a reductive gas selected from $SiH_4$ gas and $Si_2H_6$ gas into said vacuum atmosphere so as to form a film of the tungsten nitride on said substrate,
   wherein $O_2$ gas is introduced into said vacuum atmosphere when forming the tungsten nitride film.

9. The process for producing a barrier film of a tungsten nitride according to claim 8, wherein said $NH_3$ gas is introduced at a flow rate once or more higher than the flow rate of said feedstock gas, and said reductive Si-containing gas is introduced at a flow rate once or more but not more than 10 times higher than the flow rate of said $NH_3$ gas.

10. The process for producing a barrier film of a tungsten nitride according to claim 8, wherein
    said $NH_3$ gas is introduced at a flow rate once or more but not more than 5 times higher than the flow rate of said feedstock gas, and said reductive Si-containing gas is introduced at a flow rate 2 times or more but not more than 10 times higher than the flow rate of said $NH_3$ gas.

11. The process for producing a barrier film of a tungsten nitride according to claim 8, wherein said reductive Si-containing gas is introduced at a flow rate once or more but not more than 15 times higher than the flow rate of the feedstock gas.

12. The process for producing a barrier film of a tungsten nitride according to claim 8, wherein the pressure of said vacuum atmosphere is regulated to 1 Pa or more but not more than 100 Pa when said tungsten nitride film is formed.

13. The process for producing a barrier film of a tungsten nitride, comprising the steps of:
    providing a substrate on a substrate holder in a vacuum atmosphere within a CVD apparatus;
    heating said substrate;
    introducing a feedstock gas selected from tungsten hexafluoride gas and $W(CO)_6$ gas, and a $NH_3$ gas, and a reductive gas selected from $SiH_4$ gas, $Si_2H_6$ gas into said vacuum atmosphere so as to form a film of the tungsten nitride on said substrate, wherein said tungsten nitride film is formed by a plasma-free formation,
    wherein $O_2$ gas is introduced into said vacuum atmosphere when forming the tungsten nitride film.

* * * * *